US006957240B2

(12) United States Patent
Awad et al.

(10) Patent No.: US 6,957,240 B2
(45) Date of Patent: Oct. 18, 2005

(54) METHOD AND APPARATUS FOR PROVIDING AN ERROR CHARACTERIZATION ESTIMATE OF AN IMPULSE RESPONSE DERIVED USING LEAST SQUARES

(75) Inventors: Thomas Jefferson Awad, Kirkland (CA); Pascal Marcel Gervais, Montreal (CA); Martin Laurence, Montreal (CA)

(73) Assignee: Octasic Inc., Montreal (CA)

( * ) Notice: Subject to any disclaimer, the term of this patent is extended or adjusted under 35 U.S.C. 154(b) by 580 days.

(21) Appl. No.: 09/925,194

(22) Filed: Aug. 8, 2001

(65) Prior Publication Data

US 2003/0084079 A1 May 1, 2003

(51) Int. Cl.[7] .............................................. G06F 17/10
(52) U.S. Cl. ....................................................... 708/322
(58) Field of Search ................................ 708/322, 323, 708/300, 314, 320

(56) References Cited

U.S. PATENT DOCUMENTS

| 5,062,102 A | | 10/1991 | Taguchi |
| 5,117,418 A | | 5/1992 | Chaffee et al. |
| 5,200,915 A | | 4/1993 | Hayami et al. |
| 5,329,587 A | | 7/1994 | Morgan et al. |
| 5,375,147 A | | 12/1994 | Awata et al. |
| 5,442,569 A | | 8/1995 | Osano |
| 5,526,426 A | | 6/1996 | McLaughlin |
| 5,630,154 A | | 5/1997 | Bolstad et al. |
| 5,790,598 A | | 8/1998 | Moreland et al. |
| 5,889,857 A | | 3/1999 | Boudy et al. |
| 5,912,966 A | | 6/1999 | Ho |
| 5,974,377 A | | 10/1999 | Navarro et al. |
| 6,035,312 A | * | 3/2000 | Hasegawa ................... 708/322 |
| 6,151,358 A | | 11/2000 | Lee et al. |
| 6,246,773 B1 | | 6/2001 | Eastty |
| 6,396,872 B1 | * | 5/2002 | Sugiyama ................... 708/322 |
| 6,437,932 B1 | | 8/2002 | Prater et al. |
| 6,483,872 B2 | | 11/2002 | Nguyen |
| 6,622,118 B1 | | 9/2003 | Crooks et al. |
| 6,735,304 B2 | | 5/2004 | Hasegawa |
| 6,744,886 B1 | * | 6/2004 | Benesty et al. ............. 708/322 |
| 6,757,384 B1 | | 6/2004 | Ketchum et al. |
| 6,768,796 B2 | * | 7/2004 | Lu ............................. 708/322 |
| 2002/0114445 A1 | | 8/2002 | Benesty et al. |
| 2003/0031242 A1 | | 2/2003 | Awad et al. |
| 2003/0072362 A1 | | 4/2003 | Awad et al. |
| 2003/0074381 A1 | | 4/2003 | Awad et al. |

FOREIGN PATENT DOCUMENTS

| EP | 0 709 958 A1 | 5/1996 |
| EP | 0872962 A2 | 10/1998 |
| EP | 0 982 861 A2 | 3/2000 |
| GB | 2164828 A | 3/1986 |

OTHER PUBLICATIONS

B. Farhang–Bouroujeny, Adaptive Filters; Theory and Applications, John Wiley & Sons, Ltd., Chapter 12, pp. 413–437.

(Continued)

*Primary Examiner*—Kakali Chaki
*Assistant Examiner*—Chat C. Do
(74) *Attorney, Agent, or Firm*—Wolf, Greenfield & Sacks, P.C.

(57) ABSTRACT

A filter adaptation unit suitable for producing a set of filter coefficients is provided including an error characterization unit for characterizing the error in a filter's impulse response. The error characterization unit generates a set of error characterization data elements associated to a newly generated set of filter coefficents. A selection unit then makes a selection between one of the newly generated set of filter coefficients and an existing set of filter coefficients at least in part on the basis of their respective sets of error characterization data elements. The selected set of filter coefficients is then released in a format suitable for use by an adaptive filter.

22 Claims, 8 Drawing Sheets

OTHER PUBLICATIONS

William H. Press, Numerical Recipes in C: the Art of Scientific Computing, Cambridge University Press, Chapters 1–2, pp. 1–99.

Sanro Zlobec, "Linear Predictive Spectral Shaping for Acoustical Echo Cancellation", Department of Electrical Engineering, McGill University, Montreal, Canada, Nov. 1995.

Deisher M E et al., "Practical Considerations in the Implementation of a Frequency–Domain Adaptive Noise Canceller", IEEE Transactions on Circuits and Systems, II: Analog and Digital Signal Processing, IEEE Inc. New York, US, vol. 41, No. 2, Feb. 1, 1994, pp. 164–168, XP000443037.

* cited by examiner

METHOD AND APPARATUS FOR PROVIDING AN ERROR CHARACTERIZATION ESTIMATE OF AN IMPULSE RESPONSE DERIVED USING LEAST SQUARES

CROSS-REFERENCE TO RELATED APPLICATION

This application is related to the following applications:
1. U.S. Patent Application entitled, "Method and Apparatus for Generating a Set of Filter Coefficients for a Time Updated Adaptive Filter", filed on the same date as the instant application by Awad T. et al.
2. U.S. Patent Application entitled, "Method and Apparatus for Generating a Set of Filter Coefficients Providing Adaptive Noise Reduction", filed on the same date as the instant application by Awad T. et al.
3. U.S. Patent Application entitled, "Method and Apparatus for Generating a Set of Filter Coefficients", filed on the same date as the instant application by Awad T. et al.

The contents of the above noted documents are hereby incorporated by reference.

FIELD OF THE INVENTION

The present invention relates generally to adaptive systems and, more particularly, to a method and apparatus for providing error characterization data associated to a set of time updated filter coefficients derived using a least squares model. The method and apparatus are suitable for use in echo cancellation devices, equalizers and, in general, systems requiring time updated adaptive filtering.

BACKGROUND

Various adaptive filter structures have been developed for use in time updated adaptive systems to solve acoustical echo cancellation, channel equalization and other problems; examples of such structures include for example, transversal, multistage lattice, systolic array, and recursive implementations. Among these, transversal finite-impulse-response (FIR) filters are often used, due to stability considerations, and to their versatility and ease of implementation. Many algorithms have also been developed to adapt these filters, including the least-mean-square (LMS), recursive least-squares, sequential regression, and least-squares lattice algorithms.

A seldom used method for adapting the filter coefficients (also called the impulse response) of an adaptive filter is the least squares method. A deficiency of existing methods is that they provide no suitable method for characterizing and using the error function of the adaptive filter when the impulse response is derived using a least squares model.

Consequently, there is a need in the industry for providing filter adaptation unit suitable for producing a set of filter coefficients and characterizing the resulting error function that alleviates at least in part the deficiencies of the prior art.

SUMMARY OF THE INVENTION

In accordance with a broad aspect, the invention provides a method suitable for producing a set of filter coefficients suitable for use by an adaptive filter. The method includes receiving a sequence of samples of a first signal and a sequence of samples of a second signal, where the second signal includes a certain component that is correlated to the first signal. The method also includes providing a first set of error characterization data elements associated to a first set of filter coefficients. The first set of filter coefficients is such that when a filter applies the first set of filter coefficients in the first signal, a first estimate of the certain component in the second signal is generated, the certain component being correlated to the first signal. A second set of filter coefficients is then generated at least in part on the basis of the first and second signals. The second set of filter coefficients is such that when a filter applies the second set of filter coefficients on the first signal, a second estimate of the certain component in the second signal is generated, the certain component being correlated to the first signal. The first signal and the second signal are then processed on the basis of the second set of filter coefficients to generate a second set of error characterization data elements associated to the second set of filter coefficients. One of the first set of filter coefficients and the second set of filter coefficients is then selected at least in part on the basis of the first set of error characterization data elements and the second set of error characterization data elements. The selected set of filter coefficient is then released.

In a specific non-limiting example of implementation, the second set of filter coefficient is derived by applying a least squares method on the first and second signals.

In a specific example of implementation, each error characterization data element in the second set of error characterization data elements is associated to a respective frequency band selected from a set of frequency bands. Each error characterization data element in the first set of error characterization data elements is also associated to a respective frequency band selected from the same set of frequency bands. The set of frequency bands comprises one or more frequency bands.

Advantageously, the invention allows statistically characterizing the error associated to a set of filter coefficients on a per frequency band basis. This method makes it possible to select between sets of filter coefficients on the basis of characteristics of the error function in the different frequency bands.

Another advantage of this method is that the error characterization data elements provide an indication of the performance of the set of filter coefficients on a per frequency basis. This performance indication may be used for improving the performance of the filter coefficients for selected frequency bands in which the performance is unsatisfactory.

In a specific example of implementation, the first signal is filtered on the basis of the second set of filter coefficients to derive a second estimate of the certain component in the second signal. The second estimate of the certain component is then removed from the second signal to generate a noise signal. The noise signal and the first signal are processed to generate the second set of error characterization data elements.

In a non-limiting example of implementation, the first signal is processed to derive a first set of spectral values, where each spectral value corresponds to a respective frequency band selected from a set of frequency bands. The noise signal is also processed to derive a second set of spectral values, where each spectral value corresponds to a respective frequency band selected from the set of frequency bands. The second set of error characterization data elements is then generated at least in part on the basis of the first set of spectral values and the second set of spectral values. In a specific example, a standard deviation data element is computed for each frequency band in the set of frequency bands between the first signal and the noise signal to derive the second set of error characterization data elements.

Advantageously, by dividing the frequency spectrum into a set of frequency bands, the error due to the use of the first set of filter coefficients can be assumed to be substantially white within a given frequency, band provided the frequency band is sufficiently narrow. By definition a signal S is white if $E(S_iS_j)=0$ for $i \neq j$. For the purpose of this specification, signal S is white if $E(S_iS_j)$<threshold value for $i \neq j$ where the threshold value is selected based on some heuristic measurements. The assumptions that the signals are white within a given frequency band allows to characterize the error due to the use of a given set of filter coefficients in terms of the mean value and the standard deviation value of a white signal.

In accordance with another broad aspect, the invention provides an apparatus for implementing the above-described method.

In accordance with yet another broad aspect, the invention provides a computer readable medium including a program element suitable for execution by a computing apparatus for producing a set of filter coefficients in accordance with the above described method.

In accordance with another aspect, the invention provides an adaptive system. The adaptive system includes a first input for receiving a sequence of samples from a first signal and a second input for receiving a sequence of samples of a second signal, where the second signal includes a certain component which is correlated to the first signal. The adaptive system includes a filter adaptation unit and an adaptive filter.

The filter adaptation unit includes a memory unit for storing a first set of error characterization data elements associated to a first set of filter coefficients. The first set of filter coefficients is such that when an adaptive filter applies the first set of filter coefficients on the first signal, a first estimate of the certain component in the second signal is generated, the certain component being correlated to the first signal. The filter adaptation unit also includes a coefficient generation unit for generating a second set of filter coefficients at least in part on the basis of the first signal and the second signal. The second set of filter coefficients is such that when an adaptive filter applies the second set of filter coefficients on the first signal, a second estimate of the certain component in the second signal is generated, the certain component being correlated to the first signal. The filter adaptation unit also includes an error characterization unit for processing the first signal and the second signal on the basis of the second set of filter coefficients in order to generate a second set of error characterization data elements associated to the second set of filter coefficients. A selection unit then selects one of the first set of filter coefficients and the second set of filter coefficients at least in part on the basis of the first set of error characterization data elements and the second set of error characterization data elements. A signal indicative of the selected set of filter coefficients is then released at an output of the filter adaptation unit.

The adaptive filter receives the sequence of samples of the first signal and the selected set of filter coefficients. The adaptive filter applies a filtering operation to the sequence of samples of the first signal on the basis of the received set of filter coefficients to generate an estimate of the component in the second signal, the component being correlated to the first signal.

In accordance with another aspect, the invention provides an echo cancellor comprising the above-described adaptive system.

In accordance with yet another broad aspect, the invention provides a filter adaptation unit suitable for producing a set of filter coefficients. The filter adaptation unit includes means for receiving a sequence of samples of a first signal and means for receiving a sequence of samples of a second signal, where the second signal includes a certain component that is correlated to the first signal. Means for receiving a first set of error characterization data elements associated to a first set of filter coefficients are also provided. The first set of filter coefficients is such that when a filter applies the first set of filter coefficients on the first signal, a first estimate of the certain component in the second signal is generated, the certain component being correlated to the first signal. Each error characterization data element in the first set of error characterization data elements is associated to a respective frequency band selected from a set of frequency bands. Means for generating a second set of filter coefficients at least in part on the basis of the first and second signals are also provided. The second set of filter coefficients is such that when an adaptive filter applies the second set of filter coefficients on the first signal, a second estimate of the certain component in the second signal is generated. The filter adaptation unit includes means for processing the first signal and the second signal on the basis of the second set of filter coefficients to generate a second set of error characterization data elements associated to the second set of filter coefficients. Each error characterization data element in the second set of error characterization data elements is associated to a respective frequency band selected from a set of frequency bands. Means for selecting are also provided for selecting one of the first set of filter coefficients and the second set of filter coefficients at least in part on the basis of the first set of error characterization data elements and the second set of error characterization data elements. The filter adaptation unit includes means for releasing a signal indicative of the set of filter coefficients selected by the selection unit.

Other aspects and features of the present invention will become apparent to those ordinarily skilled in the art upon review of the following description of specific embodiments of the invention in conjunction with the accompanying figures.

DETAILED DESCRIPTION

Figure 1:
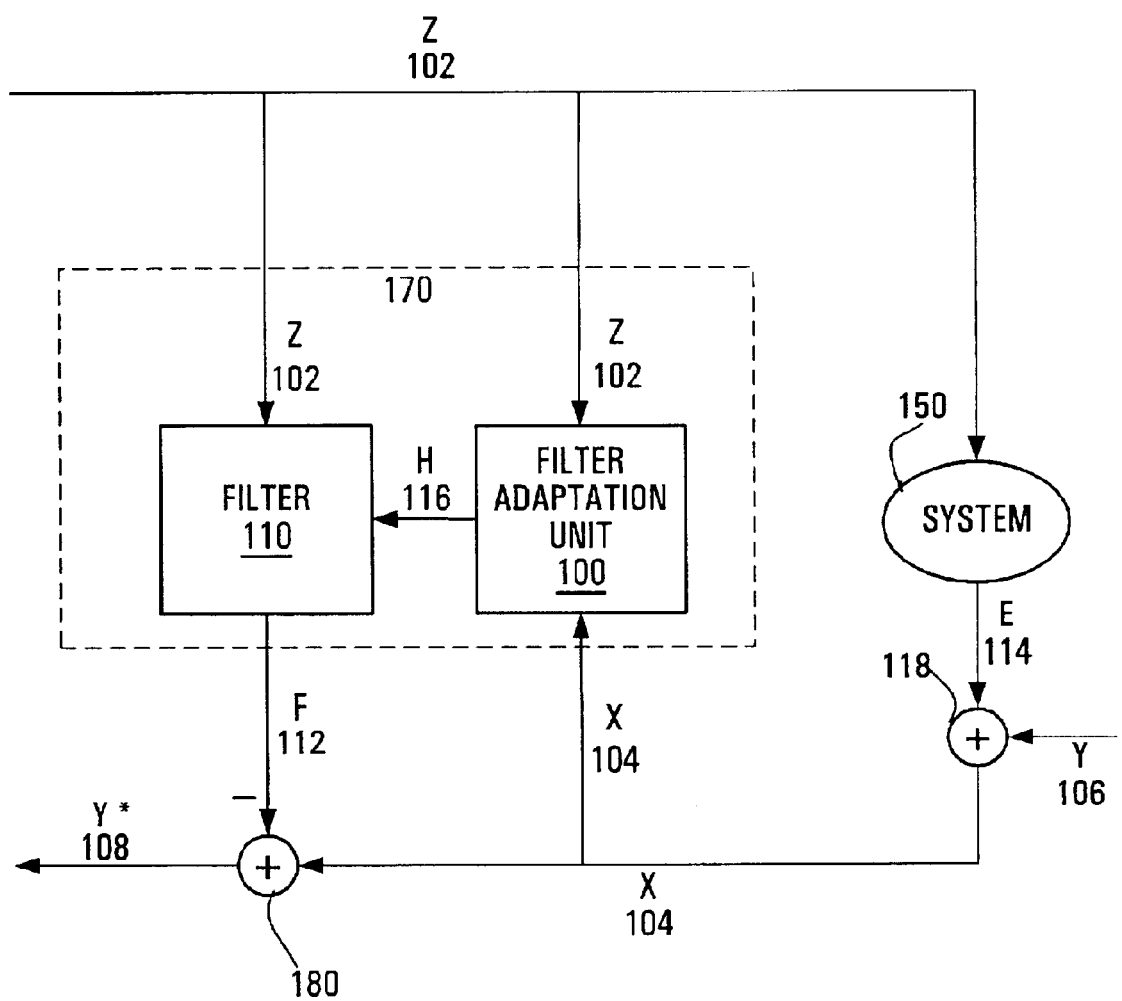
FIG. 1 is a block diagram of a time adaptive system including a filter adaptation unit in accordance with an embodiment of the present invention.

FIG. 1 shows a time adaptive system 170 in accordance with an embodiment of the present invention. In one example of a non-limiting implementation, the time adaptive system 170 is used to remove unwanted components of a return signal Z 102 from a forward signal Y 106. Typically, the return signal Z 102 passes through a system 150 and emerges in the form of a noise signal E 114 which corrupts the forward signal Y 106, resulting in a corrupted forward signal X 104. In a digital system, this corruption process may be modelled as a sample-by-sample addition performed by a conceptual adder 118. Thus, each sample of the corrupted forward signal X 104 is the sum of a component due to the (clean) forward signal Y 106 and another component due to the noise signal E 114 where the noise signal E 114 is correlated to the return signal Z 102.

A non-limiting use of the time adaptive system 170 is in the context of acoustical echo cancellation, for example, in a hands-free telephony system that includes a loudspeaker and a microphone. In this case, the forward signal Y 106 is a locally produced speech signal which is injected into the microphone (represented by conceptual adder 118), the return signal Z 102 is a remotely produced speech signal which is output by the loudspeaker, the system 150 is a room or car interior and the noise signal E 114 is a reverberated version of the return signal Z 102 which enters the same microphone used to pick up the forward signal Y 106. The corrupted forward signal X 104 is the sum of the signals input to the microphone, including the clean forward signal Y 106 as well as the reverberation represented by the noise signal E 114.

Another non-limiting use of the time adaptive system 170 is in the context of electric echo cancellation, for example, where the echo is caused by an analog/digital conversion on the transmission channel rather than by a signal reverberation in a closed space. In this case, the forward signal Y 106 is a locally produced speech signal which travels on the forward path of the communication channel, the return signal Z 102 is a remotely produced speech signal which travels on the return path of the communication channel, the system 150 is an analog/digital conversion unit and the noise signal E 114 is a reflected version of the return signal Z 102 which travels on the same forward path of the communication channel as the forward signal Y 106. The corrupted forward signal X 104 is the sum of the clean forward signal Y 106 as well as the noise signal E 114.

To cancel the corruptive effect of the noise signal E 114 on the forward signal Y 106, there is provided a filter 110, suitably embodied as an adaptive digital filter. The filter 110 taps the return signal Z 102 (which feeds the system 150) and applies a filtering operation thereto. In one embodiment of the present invention, such a filtering operation can be performed by a finite impulse response (FIR) filter that produces a filtered signal F 112.

The filter 110 includes a plurality N of taps at which delayed versions of the return signal Z 102 are multiplied by respective filter coefficients, whose values are denoted $h_j$, $0 \leq j \leq N-1$. The N products are added together to produce the filter output at time T. Simply stated, therefore, the filtered signal F 112 at a given instant in time is a weighted sum of the samples of the return signal Z 102 at various past instances.

The filter coefficients $h_j$ are computed by a filter adaptation unit 100 configured to receive the return signal Z 102 and the corrupted forward signal X 104. The manner in which the filter adaptation unit 100 processes these signals to compute the filter coefficients $h_j$ is described in greater detail herein below.

Mathematically, the filtered signal F 112 at the output of the filter 110 can be described by the following relationship:

$$f_t = \sum_{i=0}^{N-1} h_i z_{t-i} \qquad \text{Equation 1}$$

where t is the current sample time;

$f_t$ is the value of the filtered signal F 112 at time t;

$h_j$ is the value of the $j^{th}$ filter coefficient;

$z_k$ is a sample of the return signal Z 102 at time k; and

N is the length (i.e., the number of taps) of the filter 110.

For convenience, equation 1 may be represented in matrix form as follows:

$$f_t = \underline{h}^T \underline{z}_t \qquad \text{Equation 2}$$

where the underscore indicates a vector or matrix, where the superscript "$T$" denotes the transpose (not to be confused with the sample time "t" used as a subscript) and where:

$$\underline{h} = \begin{bmatrix} h_0 \\ h_1 \\ \vdots \\ h_{N-1} \end{bmatrix} \text{ and } \underline{z}_t = \begin{bmatrix} z_t \\ z_{t-1} \\ \vdots \\ z_{t-(N-1)} \end{bmatrix} \qquad \text{Equation 3}$$

The output of the filter 110, namely the filtered signal F 112, is subtracted on a sample-by-sample basis from the corrupted forward signal X 104 to yield an estimate, denoted Y* 108, of the clean forward signal Y 106. In a desirable situation, the filter coefficients $h_j$ will be selected so as to cause the resultant signal Y* 108 to be "closer" to the clean forward signal Y 106 than corrupted forward signal X 104. For at least one optimal combination of filter coefficients, the resultant signal Y* 108 will be at its "closest" to the clean forward signal Y 106.

It is sometimes convenient to define "closeness" in terms of a least-squares problem. In particular, the optimal filter coefficients are obtained by solving an optimisation problem whose object it is to minimise, from among all possible combinations of filter coefficients $h_j$, the mean square difference between instantaneous values of the resultant signal Y* 108 and the clean forward signal Y 106. The actual value of the minimum mean-square error is typically not as important as the value of the optimal filter coefficients that allow such minimum to be reached.

A reasonable assumption is that noise signal E 114 adds energy to forward signal Y 106. Therefore an expression of the least square problem is to minimise the resultant signal Y* 108. Mathematically, the problem in question can be defined as follows:

$$\min_{\underline{h}} E[(y_k^*)^2]_t, \qquad \text{Equation 4}$$

where $E[\circ]_t$ denotes the expectation of the quantity "o" over a subset of time up until the current sample time t. For the purpose of this specific example, the expression $E[\circ]_t$ will denote the summation of the quantity "o" over a subset of time up until the current sample time t. Another commonly used notation is $\Sigma[\circ]_t$. Therefore, for the purpose of this example the expressions $E[\circ]_t$ and $\Sigma[\circ]_t$ are used interchangeably.

Now, from FIG. 1 it is noted that:

$$y_k^* = x_k - f_k = x_k - \underline{h}_k^T z_k \qquad \text{Equation 5}$$

and $$x_k = y_k + e_k. \qquad \text{Equation 6}$$

Therefore, the problem stated in Equation 4 becomes:

$$\min_{\underline{h}} E[(x_k - \underline{h}^T z_k)^2]_t, \qquad \text{Equation 7}$$

Expanding the term in square brackets, one obtains:

$$(x_k - \underline{h}^T z_k)^2 = x_k^2 - 2x_k \underline{h}^T z_k + (\underline{h}^T z_k)^2. \qquad \text{Equation 8}$$

Taking the expected value of both side of equation 8, one obtains:

$$E[(x_k - \underline{h}^T z_k)^2]_t = E[x_k^2]_t - 2E[x_k \underline{h}^T z_k]_t + \qquad \text{Equation 9}$$
$$E[\underline{h}^T z_k z_k^T \underline{h}]_t$$

Minimizing the above quantity leads to a solution for which the resultant signal Y* 108 will be at its minimum and likely at its "closest" to the clean forward signal Y 106. To minimize this quantity, one takes the derivative of the right-hand side of Equation 9 with respect to the filter coefficient vector $\underline{h}$ and sets the result to zero, which yields the following:

$$\frac{d}{d\underline{h}}(E[x_k^2]_t - E[2x_k \underline{h}^T z_k]_t + E[\underline{h}^T z_k z_k^T \underline{h}]_t) = \qquad \text{Equation 10}$$
$$-2E[x_k z_k]_t + 2E[z_k z_k^T \underline{h}]_t = 0.$$

Thus, an "optimal" set of filter coefficients h*$_j$ solves the set of equations defined by:

$$E[z_k z_k^T]_t \underline{h}^* = E[x_k z_k]_t. \qquad \text{Equation 11}$$

It is noted that equation 11 expresses the filter coefficient optimisation problem in the form Ah=B, where A=E[$z_k z_k^T$]$_t$, and B=E[$x_k z_k$]$_t$ and that the matrix A and positive definite for a non-trivial signal Z 102. The usefulness of these facts will become apparent to a person of ordinary skill in the art upon consideration of later portions of this specification.

It is noted that since the properties of the signals Z 102 and X 104 change with time, so too does the optimal combination of filter coefficients h*$_j$, $0 \leq j \leq N-1$, which solves the above problem in Equation 11.

Noting that signal X=signal Y+signal E, the above equation 11 can be rewritten as follows:

$$E[z_k z_k^T]_t \underline{h}^* = E[(y_k + e_i)z_k]_t. \qquad \text{Equation 12}$$
$$E[z_k z_k^T]_t \underline{h}^* = E[e_k z_k]_t + E[y_k z_k]_t$$

In other words, we can separate the filter function defined by the set of filter coefficients h*$_j$, $0 \leq j \leq N-1$ into two components. The first term on the right hand side of the equation E[$e_k z_k$]$_t$ contributes to the desired filter behaviour since the filter 110 tries to obtain a filter such that signal F 112 equals signals E 114. Therefore, the second term on the right hand side of the equation E[$y_k z_k$]$_t$ contributes to the error behaviour of the filter 110. Therefore the error function can be expressed as follows:

$$E[z_k z_k^T]_t \underline{\text{error\_function}}^* = E[y_k z_k]_t. \qquad \text{Equation 13}$$

It will be readily observed that where signal Z 102 and signals Y 106 are perfectly uncorrelated, i.e. E[$y_k z_k$]$_t$=0 for all t, the error function is zero.

The manner in which the characteristics of the error function and the manner in which they may be used will now be described in greater detail with reference to FIG. 2, which depicts the filter adaptation unit 100 in greater detail.

The filter adaptation unit 100 includes a first input 252 for receiving a sequence of samples of a first signal Z 102, a second input 254 for receiving a sequence of samples of a second signal X 104, a coefficient generation unit 200, an error characterization unit 202, a coefficient set selection unit 204 and an output 256 for releasing an output signal indicative of a set of filter coefficients H 116. The filter adaptation unit 100 also includes a memory unit 240 for storing the last active set of filter coefficients selected by the coefficient set selection unit 204 along with a corresponding set of error characterization data elements.

Coefficient Generation Unit 200

The coefficient generation unit 200 receives the first signal Z 102 and the second signal X 104 from the first input 252 and the second input 254 respectively. The coefficient generation unit 200 is operative to generate a set of filter coefficients Hnew 206 at least in part on the basis of the first and second signals. In a specific example, the coefficient generation unit 200 applies a least squares method on the first and second signals to derive the set of filter coefficients Hnew 206. The coefficient generation unit 200 generates a set of coefficients h*$_j$, $0 \leq j \leq N-1$ by solving equation 11 reproduced below:

$$E[z_k z_k^T]_t \underline{h}^* = E[x_k z_k]_t. \qquad \text{Equation 11}$$

Figure 2:
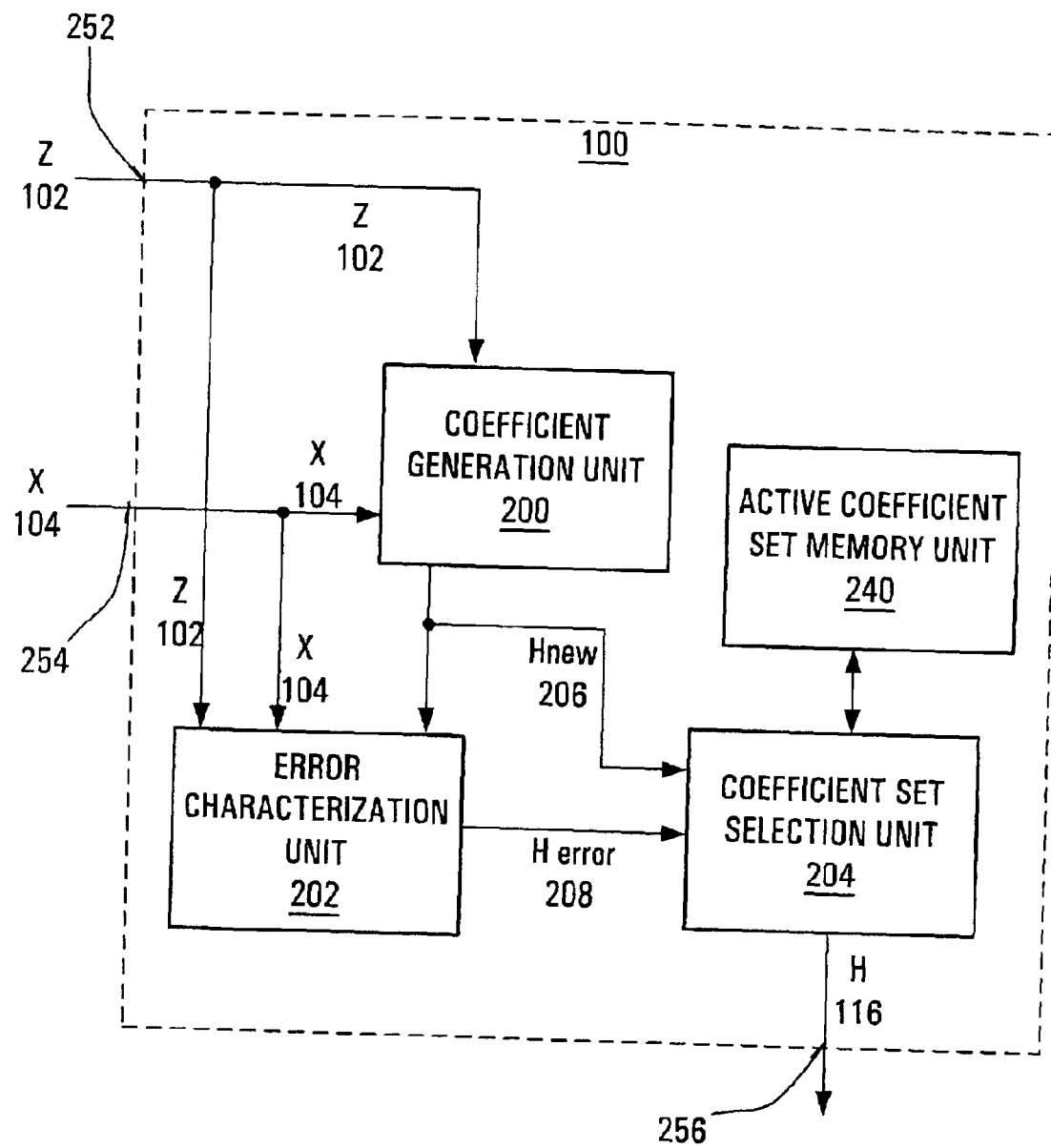
FIG. 2 is a block diagram of the filter adaptation unit of FIG. 1 in accordance with a specific example of implementation of the invention including a coefficient generation unit 200, an error characterization unit 202 and a coefficient set selection unit 204.

The coefficient generation unit 200 releases a new set of coefficients h*$_j$, designated as Hnew 206 in FIG. 2.

Figure 3:
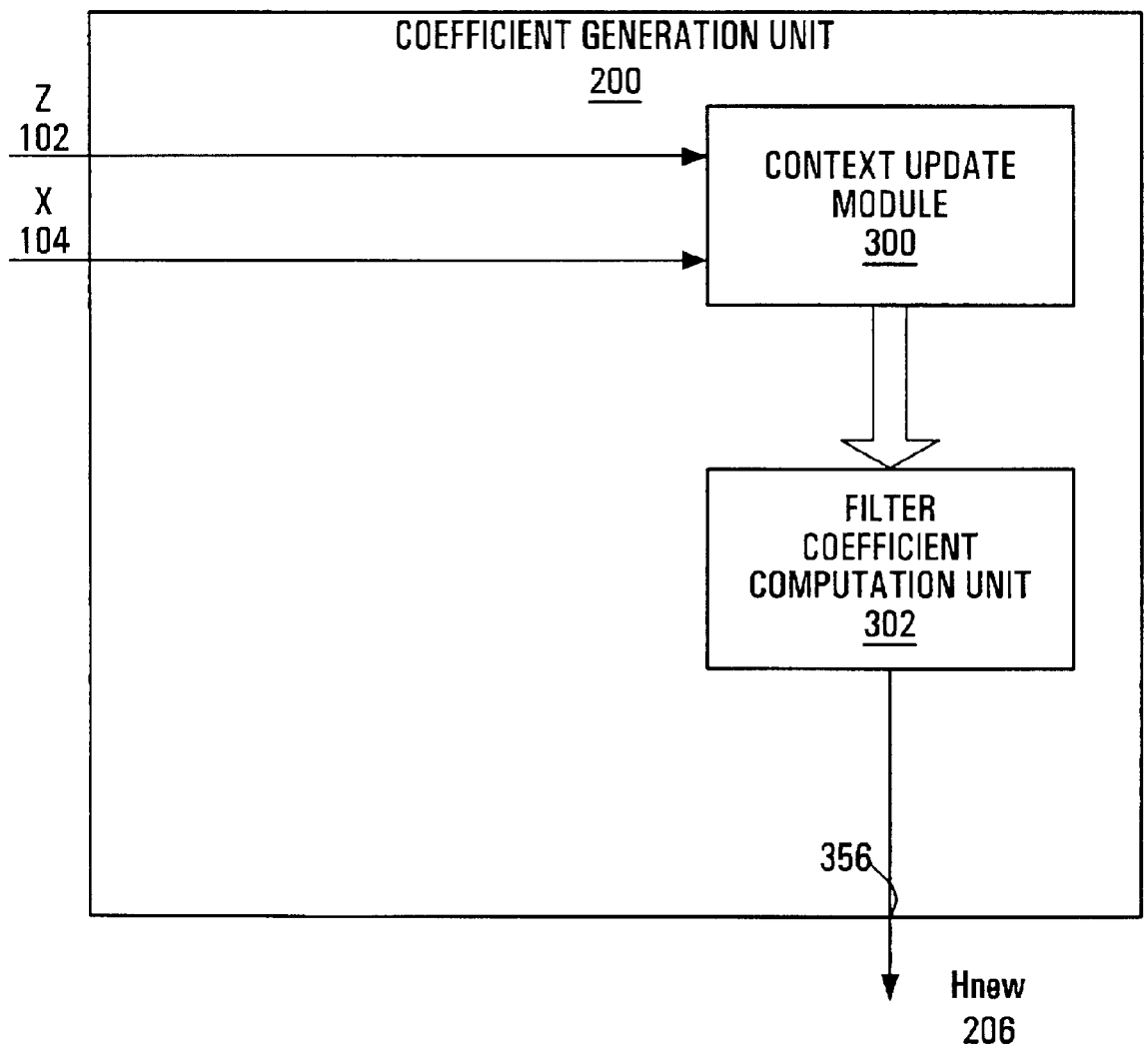
FIG. 3 is a functional block diagram of the coefficient generation unit 200 of FIG. 2 in accordance with a non-limiting example of implementation of the invention.

FIG. 3 shows a specific non-limiting implementation of the coefficient generation unit 200. As shown, the coefficient generation unit 200 includes a context update module 300 and a filter coefficient computation unit 302.

The context update module 300 receives the sequence of samples of the first signal Z 102 and the sequence of samples of the second signal X 104. The context update module 300 generates and maintains contextual information of the first signal Z 102 and the second signal X 104. The context update module 300 maintains sufficient contextual information about signals Z 102 and X 104 to be able to derive E[$z_k z_k^T$]$_t$ and E[$x_k z_k$]$_t$ for the current time t. For each new received sample of signals Z 102 and X 104 the contextual information is updated. This contextual information is then used by the filter coefficient computation unit 302 to generate the set of filter coefficients Hnew 206. The specific realization of the context update module 300 may vary from one implementation to the other without detracting from the spirit of the invention. For the purpose of this description, the contextual information comprises a first set of data elements and a second set of data elements, where the first set of data elements is indicative of the auto-correlation of signal Z 102 E[$z_k z_k^t$]$_t$. The second set of data elements is a set of cross-correlation data elements E[$x_k z_k$]$_t$ of the first signal Z 102 with the second signal X 104.

The filter coefficient computation unit 302, makes use of the contextual information provided by the context update module 300 to generate the set of filter coefficients Hnew 206. The frequency of the computation of the new set of filter coefficients Hnew 206 may vary from one implementation to the other without detraction from the spirit of the invention. In a non-limiting example, a new set of filter coefficients Hnew 206 is computed every L samples of signals Z 102, where L is >=2. The filter coefficient computation unit 302 solves equation 11 reproduced below:

$$E[z_k z_k^T]_t h^* = E[x_k z_k]_t. \qquad \text{Equation 11}$$

In a non-limiting example, the first set of data element can be represented by an N×N matrix "A" describing the expected auto-correlation of signal Z 102, $E[z_k z_k^t]_t$. Matrix "A" is symmetric and positive definite. The second set of data elements, indicative of the expected cross-correlation between signal Z 102 and signal X 104, can be represented by a vector "B" of M elements, $E[x_k z_k]_t$. Finally the set of filter coefficients can be represented by a third vector $\underline{h}^*$. The relationship between "A", "B" and $\underline{h}^*$ can be expressed by the following linear equation:

$$A\underline{h}^* = B \qquad \text{Equation 14}$$

If M=N, a single vector $\underline{h}^*$ can be computed from the above equation. If M>N, then a vector $\underline{h}^*$ can be computed for each N elements of vector "B". For the purpose of simplicity, we will describe the case where N=M where one set of filter coefficients is generated by the filter coefficient computation unit 302 by solving the above equation. There are many known methods that can be used to solve a linear equation of the type described in the above equation and consequently these will not be described further here.

The generated set of filter coefficients Hnew 206 is then released at the output 356 of the coefficient generation unit.

Error Characterization Unit 202

In accordance with a specific implementation, the error characterization unit 202 characterizes the error function associated with adaptive filter 170 on the basis of the knowledge of the amplitude of the first signal Z 102 and of an estimate of the amplitude of the forward signal Y 106.

Theoretical Explanation

As was described previously, the error function can be expressed by equation 13 reproduced below:

$$E[z_k z_k^T]_t \underline{\text{error\_function}}^* = E[y_k z_k]_t. \qquad \text{Equation 13}$$

In order to characterize the error function of the adaptive filter 170, a single tap filter is considered. In a single point tap system where $E[z_i z_i^T]_t$ has a single data element and $E[y_i z_i]_t$ has a single data element, equation 13 can be written as follows:

$$\sum_{i=0}^{t-1} z_i z_i \underline{\text{error\_function}} = \sum_{i=0}^{t-1} z_i y_i. \qquad \text{Equation 15}$$

Solving for the error function at time t we obtain:

$$\text{error\_function}(t) = \frac{\sum_{i=0}^{t-1} z_i y_i}{\sum_{i=0}^{t-1} z_i z_i} \qquad \text{Equation 16}$$

where t is the current sample time;

$z_k$ is a sample of the return signal Z 102 at time k; and $y_k$ is a sample of the return signal Y 106 at time k;

For the purpose of deriving a mathematical model to characterize the error function, an assumption is made that signal Z 102 and signal Y 106 are substantially independent of one another and are white. For the purpose of this specification, a signal S is white if $E(S_i S_j) \approx 0$ for $i \neq j$ and signals S and Q are independent if $E(S_i Q_j) \approx 0$ for all i,j. The above assumptions allow considering that the error added by each sample pair is an independent variable which can be described by the following expression:

$$\text{error}_k = \frac{z_k y_k}{z_k z_k} \qquad \text{Equation 17}$$

where $z_k$ and $y_k$ are the kth samples of signals Z 102 and Y 106 respectively and $\text{error}_k$ is the kth component of the error function due to the kth samples of signals Z 102 and Y 106. The error function can be considered as the sum of the errors added by the samples. In statistics, the above described error function can be considered to be a random variable. In order to characterize this random variable, the mean and the variance (or alternatively the standard deviation) can be computed. Since signal Z and signal Y are assumed to be independent, the mean of this random variable is 0 and it will be shown below that the standard deviation can be given by:

$$\sigma_t = \frac{\left(\sum_{i=0}^{t-1}(z_i y_i)^2\right)^{\frac{1}{2}}}{\left[\left(\sum_{i=0}^{t-1} z_i z_i\right)^2 - \left(\sum_{i=0}^{t-1}(z_i z_i)^2\right)\right]^{\frac{1}{2}}} \qquad \text{Equation 18}$$

Deriving the Standard Deviation Equation

The error inserted at each pair of samples $\{z_i, y_i\}$ can be represented mathematically by the following:

$$\text{error} = \frac{z_i y_i}{z_i z_i} \qquad \text{Equation 19}$$

If the error components inserted at each pair of samples are equal to one another and are assigned equal weight, standard deviation of the error function after t samples can be expressed by the following expression:

$$\sigma_t = \frac{\text{error}}{\sqrt{t}} \quad \begin{array}{l}\text{where t is the number of samples}\\ \text{and } \textit{error} \text{ is the error per sample}\end{array} \qquad \text{Equation 20}$$

When each sample has an error that is different from the other and has a different weight, the standard deviation of the error function can be expressed as the division of two terms namely the average error over time and the number of samples conditioned by the weight. The average standard deviation of the error function can be expressed as follows:

$$\sigma_A = \frac{\left(\sum_{i=0}^{t-1}(error_{t_i} * w_i)^2\right)^{\frac{1}{2}}}{\left(\sum_{i=0}^{t-1} w_i^2\right)^{\frac{1}{2}}} \qquad \text{Equation 21}$$

where $w_i$ is a weight value associated to a given error component. The square root of the number of samples conditioned by the weight which corresponds to $\sqrt{t}$ of Equation 20:

$$\text{Sample number} = \frac{\sum_{i=0}^{t-1} w_i}{\left(\sum_{i=0}^{t-1} w_i^2\right)^{\frac{1}{2}}} \qquad \text{Equation 22}$$

Therefore the standard deviation computation can be reduced to the following expression:

$$\sigma_t = \frac{\left(\sum_{i=0}^{t-1}(error_i * w_i)^2\right)^{\frac{1}{2}}}{\sum_{i=0}^{t-1} w_i} \qquad \text{Equation 23}$$

In a least squares context, the weight $w_k$ of the error for each sample k is $z_k z_k$. Therefore, in the current specific example, the standard deviation of the error function can be expressed as follows:

$$\sigma_t = \frac{\left(\sum_{i=0}^{t-1}\left(\frac{z_i y_i}{z_i z_i} * z_i z_i\right)^2\right)^{\frac{1}{2}}}{\sum_{i=0}^{t-1} z_i z_i} \qquad \text{Equation 24}$$

which can be reduced to the following:

$$\sigma_t = \frac{\left(\sum_{i=0}^{t-1}(z_i y_i)^2\right)^{\frac{1}{2}}}{\sum_{i=0}^{t-1} z_i z_i} \qquad \text{Equation 25}$$

In statistics, it is well known that when an unbiased estimator of the variance (or standard deviation) of a set of sample is to be obtained, the sample number is reduced by "1" to obtain an unbiased effective sample set. The effective sample set can be expressed by:

$$\text{Effective Sample number} = \left[\frac{\left(\sum_{i=0}^{t-1} w_i\right)^2}{\left(\sum_{i=0}^{t-1} w_i^2\right)} - 1\right]^{\frac{1}{2}} \qquad \text{Equation 26}$$

Therefore the standard deviation computation can be reduced as follows:

$$\sigma_t = \frac{\left(\sum_{i=0}^{t-1}(error_i * w_i)^2\right)^{\frac{1}{2}}}{\left(\sum_{i=0}^{t-1} w_i^2\right)^{\frac{1}{2}}} * \frac{1}{\left[\frac{\left(\sum_{i=0}^{t-1} w_i\right)^2}{\left(\sum_{i=0}^{t-1} w_i^2\right)} - 1\right]^{\frac{1}{2}}} \qquad \text{Equation 27}$$

$$\sigma_t = \frac{\left(\sum_{i=0}^{t-1}(error_i * w_i)^2\right)^{\frac{1}{2}}}{\left(\sum_{i=0}^{t-1} w_i^2\right)^{\frac{1}{2}}} * \frac{\left(\sum_{i=0}^{t-1} w_i^2\right)^{\frac{1}{2}}}{\left[\left(\sum_{i=0}^{t-1} w_i\right)^2 - \left(\sum_{i=0}^{t-1} w_i^2\right)\right]^{\frac{1}{2}}} \qquad \text{Equation 28}$$

$$\sigma_t = \frac{\left(\sum_{i=0}^{t-1}(error_i * w_i)^2\right)^{\frac{1}{2}}}{\left[\left(\sum_{i=0}^{t-1} w_i\right)^2 - \left(\sum_{i=0}^{t-1} w_i^2\right)\right]^{\frac{1}{2}}} \qquad \text{Equation 29}$$

In a least squares context, the weight $w_k$ of the error for each sample k is $z_k z_k$. Therefore, in this second specific example, the standard deviation of the error function can be expressed as follows:

$$\sigma_t = \frac{\left(\sum_{i=0}^{t-1}(z_i y_i)^2\right)^{\frac{1}{2}}}{\left[\left(\sum_{i=0}^{t-1} z_i z_i\right)^2 - \left(\sum_{i=0}^{t-1}(z_i z_i)^2\right)\right]^{\frac{1}{2}}} \qquad \text{Equation 30}$$

For the purpose of a specific implementation, equation 30 is used to characterize the standard deviation of the error function.

Adjustments for the Assumptions

As previously indicated, the above computations are based on the assumption that signals Z 102 and Y 106 are white and independent. The assumption that signal Z 102 and signal Y 106 are independent is reasonable for many applications of adaptive filtering. It will be readily appreciated that when signal Z 102 and signal Y 106 are not exactly independent, the computations described in this specification may nevertheless be used with the knowledge that certain errors factors may be introduced by this approximation.

However, the assumption that signals Z 102 and Y 106 are white is not true in most applications. In order to solve this problem, signals Z 102 and Y 106 are divided spectrally into a set of frequency bands, where signal Z 102 and Y 106 can be considered to generally be substantially white within a given frequency band. In the non-limiting example of implementation of an echo cancellor, the signals Z 102 and Y 106 (assuming a sampling rate of 8000 samples/sec and therefore a frequency spectrum from 0–4000 Hz) are divided into 257 frequency bands of 15.625 Hz each. Using heuristics measurements, this width has been found to be narrow enough that voice is approximately a white signal across each of the 15.625 Hz bands. The width of the bands may vary from one application to another without detracting from the spirit of the invention. The "whiteness" of the signal is a subjective quality and depends on the nature of the signals being processed. The error function is then characterized for each frequency band independently using the above described computation to estimate the mean (which is 0) and the standard deviation. For each frequency band, the standard deviation of the error function can be computed as follows:

$$\sigma_t[j] = \frac{\left(\sum_{i=0}^{t-1}(z_i[j]y_i[j])^2\right)^{\frac{1}{2}}}{\sum_{i=0}^{t-1}z_i[j]z_i[j]}$$ Equation 31 where z[j] and y[j] is the amplitude of the component of signal Z 102 and signal Y 106 respectively in frequency band j and $\sigma_t[j]$ is the standard deviation of the error function in frequency band j at time t.

Another assumption in the above computations is that the amplitude (or energy) of signal Y 106 is known. However, signal Y 106 is unknown since, if signal Y 106 were known, the adaptive filter 170 would serve no practical purpose. The amplitude of signal Y 106 can be approximated by the amplitude of signal Y* 108. More specifically, in a least squares system, the forward signal Y 106 can be considered as made up of two (2) components, namely a first component Yc which is correlated with signal Z 102 and a second component Yu which is uncorrelated with signal Z 102. Because, by definition, Yc and Yu are uncorrelated, the energy of forward signal Y 106 is equal to the sum of the energies of Yc and Yu. Mathematically, this can be expressed as follows:

$$Y\text{energy} = Yc\text{energy} + Yu\text{energy}$$ Equation 32

The filter 110 in combination with adder 180 will generally eliminate signal Yc. Therefore, the energy of signal Y* 108 will be essentially equal to the Yu energy which is less than or equal to the energy of signal Y 106. Therefore, since signal Y 106 is not available, the energy of signal Y* 108 is used as an approximation of the energy of signal Y 106. For each frequency band, the standard deviation of the error function using Y* 108 can be computed as follows:

$$\sigma_t[j] = \frac{\left(\sum_{i=0}^{t-1}(z_i[j]y_i^*[j])^2\right)^{\frac{1}{2}}}{\left[\left(\sum_{i=0}^{t-1}z_i[j]z_i[j]\right)^2 - \left(\sum_{i=0}^{t-1}(z_i[j]y_i^*[j])^2\right)\right]^{\frac{1}{2}}}$$ Equation 33

Finally, although the above described standard deviation computations have been derived for an adaptive system having a single tap filter, similar derivations may be effected for a filter having N taps. In a practical application, for a filter having N taps, the standard deviation computation becomes:

$$\sigma_t[j] = \frac{\left(\sum_{i=0}^{\frac{t}{N}-1}(z_{N*i}[j]y_{N*i}^*[j])^2\right)^{\frac{1}{2}}}{\left[\left(\sum_{i=0}^{\frac{t}{N}-1}z_{N*i}[j]z_{N*i}[j]\right)^2 - \left(\sum_{i=0}^{\frac{t}{N}-1}(z_{N*i}[j]z_{N*i}[j])^2\right)\right]^{\frac{1}{2}}}$$ Equation 34

In view of the above description, deriving a standard deviation computation for N>1 will be readily apparent to the person skilled in the art and as such will not be described further.

Specific Implementation

As depicted in FIG. 2, the error characterization unit 202 receives the first signal Z 102, the second signal X 104 and the new set of filter coefficients Hnew 206 from the coefficient generation unit 200. The error characterization unit 202 is operative to generate at least in part on the basis of the first signal Z 102 and the second signal X 104 a set of error characterization data elements Herror 208 associated to the new set of filter coefficients Hnew 206. The error characterization unit 202 characterizes the error on a per-frequency band basis. Each error characterization data element in Herror 208 is a statistical estimate of the error function standard deviation for a respective frequency band.

Figure 4:
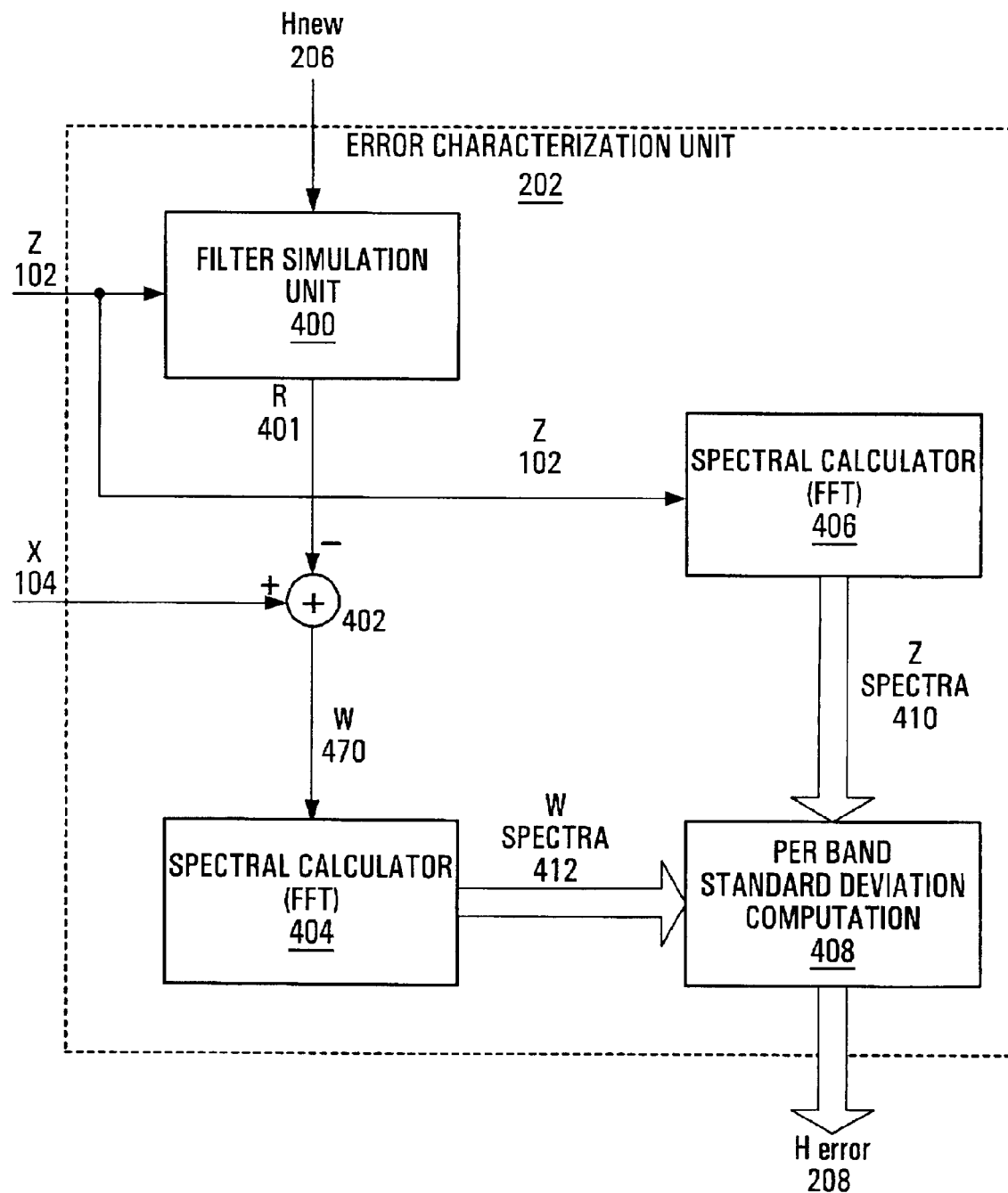
FIG. 4 is a functional block diagram of the error characterization unit 202 of FIG. 2 in accordance with an example of implementation of the invention.

FIG. 4 shows a specific example of implementation of the error characterization unit 202 including a filter simulation unit 400, an adder unit 402, a first spectral calculator 406, a second spectral calculator 404 and a per-band standard deviation computation unit 408.

The filter simulation unit 400 is suitably embodied as an adaptive digital filter and simulates the processing of filter 110 shown in FIG. 1. The filter simulation unit 400 taps the return signal Z 102, and receives the new set of filter coefficients Hnew 206 from the coefficient generation unit 200. The filter simulation unit 400 applies a filtering operation corresponding to the filter coefficients Hnew 206 to the return signal Z 102 to produce filtered signal R 401. The manner in which the filtering operative is applied was described with regard to filter 110 in FIG. 1 and therefore will not be repeated here.

The output of the filter simulation unit 400, namely the filtered signal R 401, is subtracted by unit 402 on a sample-by-sample basis from the corrupted forward signal X 104 to yield a signal denoted W 470. Signal W 470 is an estimate of signal Y 106 (FIG. 1) generated on the basis of the set of filter coefficients Hnew 206.

Spectral calculator 406 taps the first signal Z 102 and divides the signal into a set of frequency bands. In a non-limiting example, the spectral calculator processes a set of samples of signal Z 102 from which the set of filter coefficients Hnew 206 was generated, where the first sample of the set of samples was taken at time t=1. The spectral calculator 406 applies a set of Fast Fourier Transform (FFT) of length (K−1)*2, each Fast Fourier Transform (FFT) being applied to N of the samples of taps of the adaptive filter 170. The computation of an FFT is well known in the art to which this invention pertains and as such will not be described further herein. For a given time t, the above calculation results into t/N sets of K spectral values of signal Z 102, each spectral value being associated to a respective frequency band from a set of K frequency bands. In a non-limiting example used in echo cancellation, K=257 is used to divide the frequency spectrum of signal Z 102 into 257 frequency bands. If the frequency spectrum goes from 0 Hz to 4000 Hz (assuming a sampling rate of 8000 Hz), then there will be frequency bands centered at 0 Hz, 15.625 Hz, 15.625*2 Hz, 15.625*3 Hz, [ . . . ] and 4000 Hz.

Mathematically, this can be expressed as follows:

$$Z_{SPECTRA} = FFT(z(t))$$

$$= \begin{bmatrix} Z_{SPECTRA}(0) \\ Z_{SPECTRA}(1) \\ Z_{SPECTRA}(2) \\ \vdots \\ Z_{SPECTRA}(K-2) \\ Z_{SPECTRA}(K-1) \end{bmatrix}_0 \begin{bmatrix} Z_{SPECTRA}(0) \\ Z_{SPECTRA}(1) \\ Z_{SPECTRA}(2) \\ \vdots \\ Z_{SPECTRA}(K-2) \\ Z_{SPECTRA}(K-1) \end{bmatrix}_1 \cdots \begin{bmatrix} Z_{SPECTRA}(0) \\ Z_{SPECTRA}(1) \\ Z_{SPECTRA}(2) \\ \vdots \\ Z_{SPECTRA}(K-2) \\ Z_{SPECTRA}(K-1) \end{bmatrix}_{\frac{t}{N}-1}$$

$$\text{where } Z_{j,SPECTRA} = \begin{bmatrix} Z_{SPECTRA}(0) \\ Z_{SPECTRA}(1) \\ Z_{SPECTRA}(2) \\ \vdots \\ Z_{SPECTRA}(K-2) \\ Z_{SPECTRA}(K-1) \end{bmatrix}_j$$

Equation 35 where $Z_{SPECTRA}$ 410 is a data structure of t/N vectors each of size K, each vector being indicative of a spectral representation of N samples of signal z(t) and $Z_{SPECTRA}$ (j) is the spectral value of signal Z 102 associated to frequency band j. $Z_{SPECTRA}$ 410 is released by the spectral calculator 404.

Second spectral calculator 404 taps the signal W 470 and divides the signal into a set of K frequency bands. In a non-limiting example, the second spectral calculator 404 processes a set of samples of signal W 470 corresponding to the set of samples of Z 102 processed by first spectral calculator 406, where the first sample of the set of samples of signal W 470 was taken at time t=1. The first spectral calculator 406 applies a set of Fast Fourier Transform (FFT) of length (K−1)*2, each Fast Fourier Transform (FFT) being applied to N of the samples of signal W 470 where N is the number of taps of the adaptive filter 170. The computation of an FFT is well known in the art to which this invention pertains and as such will not be described further herein. For a given time t, the above calculation results into t/N sets of K spectral values of signal W 470, each spectral value being associated to a respective frequency band from a set of K frequency bands. Mathematically, this can be expressed as follows:

Methods other than the FFT for dividing a signal into a set of frequency bands may be used by the spectral calculators 404, 406, such as for example, a cosine transform and other similar transforms. Although spectral calculator 406 and spectral calculator 404 are depicted as separate components in FIG. 4, it will be readily appreciated that they may be embodied in a same physical device and may share functional components without detracting from the spirit of the invention.

The per-band standard deviation computation unit 408 receives $W_{SPECTRA}$ 412 and $Z_{SPECTRA}$ 410 and processes each frequency band to generate an error characterization estimate Herror[j] for each band j, for j=0 . . . K−1. In a specific implementation, Herror[j] is the standard deviation of error function for frequency band j.

Figure 5:
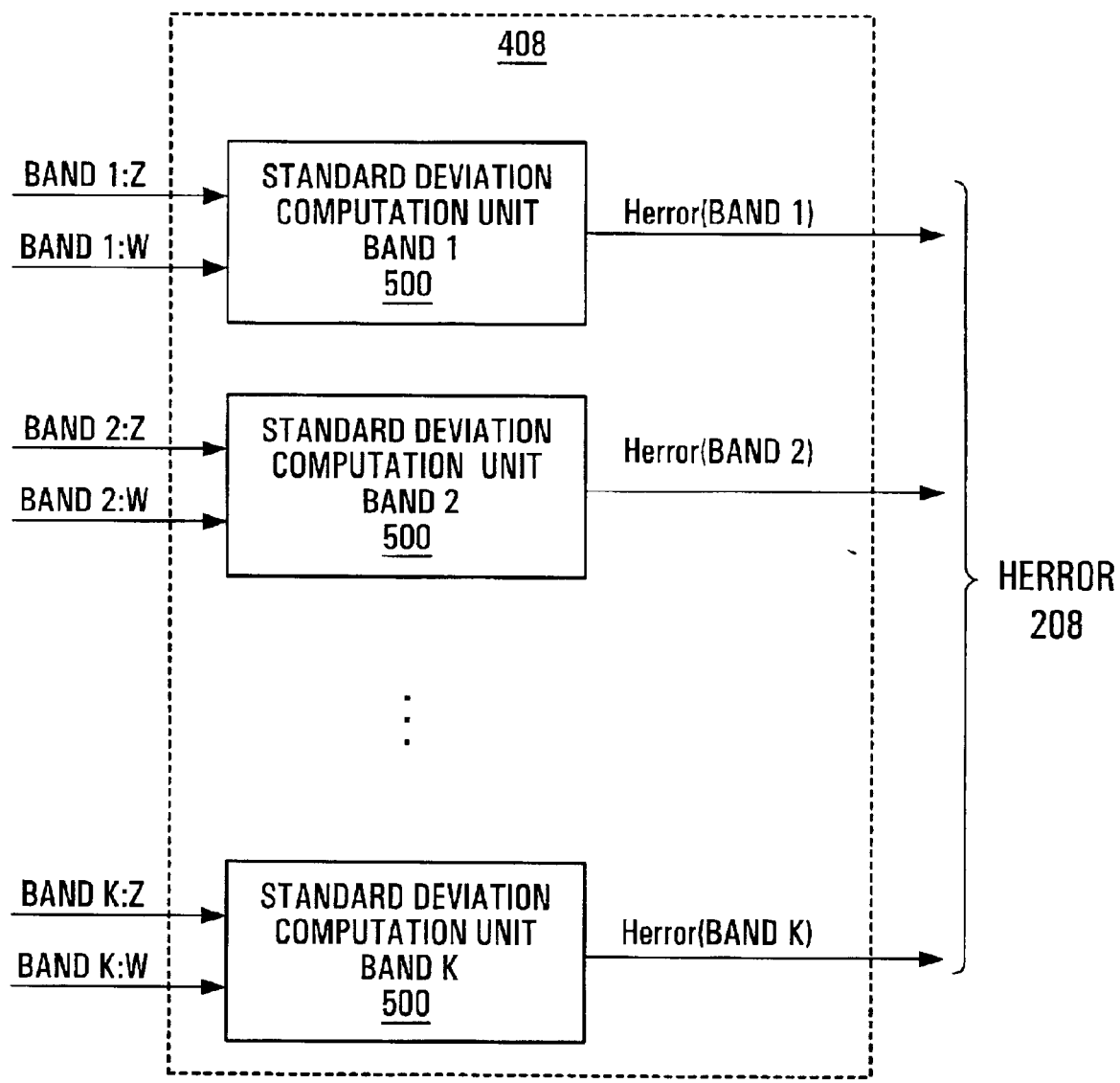
FIG. 5 is a functional block diagram of a standard deviation computation unit suitable for use in the error characterization unit in accordance with a non-limiting example of implementation.

FIG. 5 shows a conceptual block diagram of the per-band standard deviation computation unit 408. As depicted, the per-band standard deviation computation unit 408 includes a set of K parallel computation units 500 where each unit 500 is operative to compute the standard deviation of the error function for a respective frequency band. If the frequency bands are narrow, the signals Z 102 and W 470 can be considered "white" within a frequency band, thereby allowing the following computation to be used:

$$W_{SPECTRA} = FFT(w(t))$$

$$= \begin{bmatrix} W_{SPECTRA}(0) \\ W_{SPECTRA}(1) \\ W_{SPECTRA}(2) \\ \vdots \\ W_{SPECTRA}(K-2) \\ W_{SPECTRA}(K-1) \end{bmatrix}_0 \begin{bmatrix} W_{SPECTRA}(0) \\ W_{SPECTRA}(1) \\ W_{SPECTRA}(2) \\ \vdots \\ W_{SPECTRA}(K-2) \\ W_{SPECTRA}(K-1) \end{bmatrix}_1 \cdots \begin{bmatrix} W_{SPECTRA}(0) \\ W_{SPECTRA}(1) \\ W_{SPECTRA}(2) \\ \vdots \\ W_{SPECTRA}(K-2) \\ W_{SPECTRA}(K-1) \end{bmatrix}_{\frac{t}{N}-1}$$

$$\text{where } W_{j,SPECTRA} = \begin{bmatrix} W_{SPECTRA}(0) \\ W_{SPECTRA}(1) \\ W_{SPECTRA}(2) \\ \vdots \\ W_{SPECTRA}(K-2) \\ W_{SPECTRA}(K-1) \end{bmatrix}_j$$

Equation 36 where $W_{SPECTRA}$ 412 is a data structure of t/N vectors each of size K, each vector being indicative of a spectral representation of N samples signal W 470 and $W_{SPECTRA}$(j) is the spectral value of signal W 470 associated to frequency band j. $W_{SPECTRA}$ 412 is released by the spectral calculator 404.

for $j = 0 \ldots K-1$.

Equation 37

$$H_{error}[j] = \frac{\sum_{i=0}^{\frac{t}{N}-1}((W_{i,SPECTRA}[j] \times Z_{i,SPECTRA}[j])^2)^{\frac{1}{2}}}{\left[\left(\sum_{i=0}^{\frac{t}{N}-1} Z_{i,SPECTRA}[j] \times Z_{i,SPECTRA}[j]\right)^2 - \left(\sum_{i=0}^{\frac{t}{N}-1} (Z_{i,SPECTRA}[j] \times Z_{i,SPECTRA}[j])^2\right)\right]^{\frac{1}{2}}}$$

where Herror[j] is the error characterization data element for frequency band j and Herror 208 is a set of K error characterization data elements.

The skilled person in the art will readily appreciate that the implementation depicted in FIG. 4 is for the purpose of example only as many other implementations are possible.

Although the above described specific examples of implementations show the computations in the frequency domain of the auto-correlation of signal Z 102 and the cross-correlation of signals Z 102 and W 470, it is to be understood that the equivalent of either of these computations may be effected in the time domain without detracting from the spirit of the invention. For example, the auto-correlation and cross-correlation computations may be effected in the time domain while the computation of the standard deviation is effected in the frequency domain.

Figure 6:
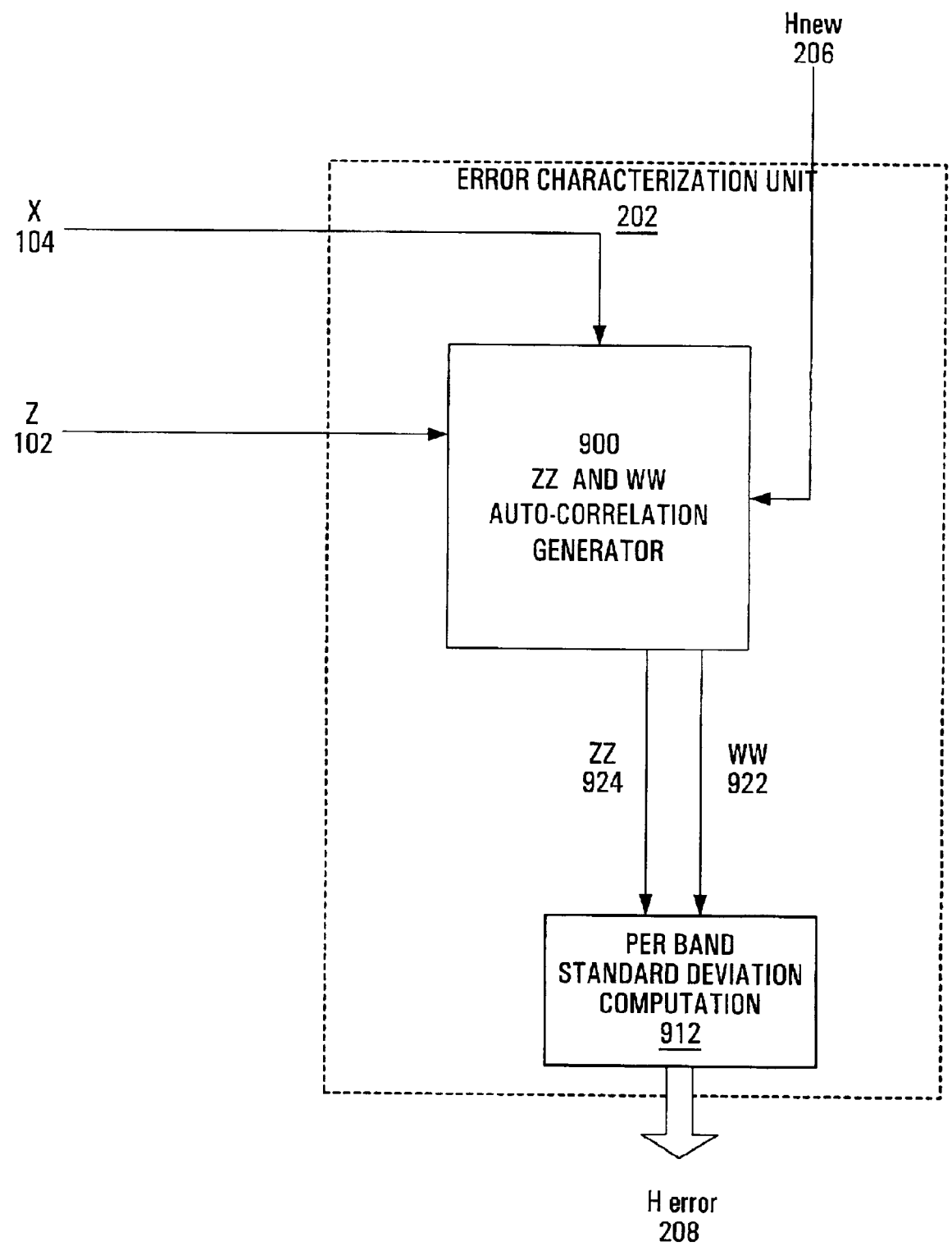
FIG. 6 is a functional block diagram of an alternative non-limiting example of implementation of the error characterization unit 202 of FIG. 2 in accordance with an example of implementation of the invention.

FIG. 6 shows an alternative non-limiting implementation of the error characterization unit 202 including a ZZ and WW auto-correlation generator 900 and a per-band standard deviation computation unit 912. It can be noted that Herror can be expressed as follows:

For $j = 0 \ldots K-1$  Equation 38

$$H_{error}[j] = \frac{\sum_{i=0}^{\frac{t}{N}-1}((W_{i,SPECTRA}[j] \times W_{i,SPECTRA}[j] \times Z_{i,SPECTRA}[j] \times Z_{i,SPECTRA}[J]))^{\frac{1}{2}}}{\left[\left(\sum_{i=0}^{\frac{t}{N}-1} Z_{i,SPECTRA}[j] \times Z_{i,SPECTRA}[j]\right)^2 - \left(\sum_{i=0}^{\frac{t}{N}-1} (Z_{i,SPECTRA}[j] \times Z_{i,SPECTRA}[j])^2\right)\right]^{\frac{1}{2}}}$$

Note that $W_{i,SPECTRA}[j] \times W_{i,SPECTRA}[j]$ is the $i^{th}$ component of the auto-correlation of signal W 470 in frequency band j. Note that:

$$(W_{i,SPECTRA}[j] \times W_{i,SPECTRA}[j]) = \quad \text{Equation 39}$$

$$(X_{i,SPECTRA}[j] - Z_{i,SPECTRA}[j] \otimes h(t))^2 =$$

$$X_{i,SPECTRA}[j] \times X_{i,SPECTRA}[j] - 2X_{i,SPECTRA}[j]$$

$$Z_{i,SPECTRA}[j] \otimes h(t) + Z_{i,SPECTRA}[j] \times Z_{i,SPECTRA}[j] \times$$

$$Z_{i,SPECTRA}[j] \times Z_{i,SPECTRA}[j] \otimes h(t) \otimes h(t)$$

where $\otimes$ denotes a convolution operation. As can be seen from the above equation, the auto-correlation of signal W 470 can be obtained from the auto-correlation of signal X 104, the auto-correlation of signal Z 102 and the cross-correlation of signal Z 102 with signal X 104.

The ZZ and WW auto-correlation generator 900 is operative to generate a sequence of $W_{l,SPECTRA}[j] \times W_{l,SPECTRA}[j]$ auto-correlation data elements, shown as WW 922 in FIG. 6, on the basis of the relationship described in equation 38 above and a sequence of $Z_{l,SPECTRA}[j] \times Z_{l,SPECTRA}[j]$ auto-correlation data elements, shown as ZZ 924 in FIG. 6. The ZZ and WW auto-correlation generator 900 may be implemented in a number of ways and the specific implementation is not a limiting element of the invention.

The per-band standard deviation computation unit 912 receives a sequence of $W_{l,SPECTRA}[j] \times W_{l,SPECTRA}[ ]$ auto-correlation data elements and a sequence of $Z_{l,SPECTRA}[j] \times Z_{l,SPECTRA}[j]$ and computes Herror[j] for $j=0 \ldots K-1$ using the following relationship:

$$H_{error}[j] = \frac{\sum_{i=0}^{\frac{t}{N}-1}((W_{i,SPECTRA}[j] \times W_{i,SPECTRA}[j] \times (Z_{i,SPECTRA}[j] \times Z_{i,SPECTRA}[J]))^{\frac{1}{2}}}{\left[\left(\sum_{i=0}^{\frac{t}{N}-1} Z_{i,SPECTRA}[j] \times Z_{i,SPECTRA}[j]\right)^2 - \left(\sum_{i=0}^{\frac{t}{N}-1} (Z_{i,SPECTRA}[j] \times Z_{i,SPECTRA}[j])^2\right)\right]^{\frac{1}{2}}} \quad \text{Equation 40}$$

Herror 208 is released by the error characterization unit 202.

Active Coefficient Set Memory Unit 240

The active coefficient set memory unit 240 stores a set of filter coefficients most recently selected by the coefficient set selection unit 204, herein referred to as Hbest, along with its associated set of error characterization data elements, herein referred to as Hbest_error. The Hbest_error includes K data elements each data element being associated to a respective frequency band.

Coefficient Set Selection Unit 204

The coefficient set selection unit 204 is operatively coupled to the active coefficient set memory unit 240 to receives Hbest along with its associated set of error characterization data elements, Hbest_error. The coefficient set selection unit 204 receives the set of filter coefficients Hnew 206 generated by the coefficient generation unit 200 as well as the associate set of error characterization data elements Herror 208 generated by the error characterization unit 202. The coefficient set selection unit 204 compares the set of error characterization data elements associated to Hnew 206 and the set of error characterization data elements associated to Hbest in order to select the set of filter coefficients H 116 to be released. The comparison criteria may be based on various criteria designed to select a set of filter coefficients that minimize the error function. In a non-limiting example, the coefficient set selection unit 204 selects the set of filter coefficients that minimize the average error over all the frequency bands. More generally, the coefficient set selection unit 204 selects the set of filter coefficients that minimize a weighted sum of the error characterization data elements over all the frequency bands. Mathematically, this second example may be expressed as follows:

If Weighted(Herror) ≤ Weighted(Hbest_error)  Equation 41 then Hbest_error = Herror

Hbest = Hnew else no charge where

-continued $$\text{Weighted}(Herror) = \sum_{j=0}^{K-1} w_j Herror[j]$$

$$\text{Weighted}(Hbest\_error) = \sum_{j=0}^{K-1} w_j Hbest\_error[j]$$

where $w_j$ is a weight associated to frequency band j. In other words, if the weighted sum of the error characteristic data elements of the new set of filter coefficients (Hnew) is less than or equal to the weighted sum of the error characteristic data elements of the set of filter coefficients currently being released (Hbest), then the new set of filter coefficients is selected and stored in the active coefficient set memory unit 240 along with its set of error characterization data elements. Otherwise, the current set of filter coefficients remains Hbest. Following this, the set of filter coefficients in the active coefficient set memory unit 240 is released in a format suitable for use by filter 110.

A Typical Interaction

Figure 7:
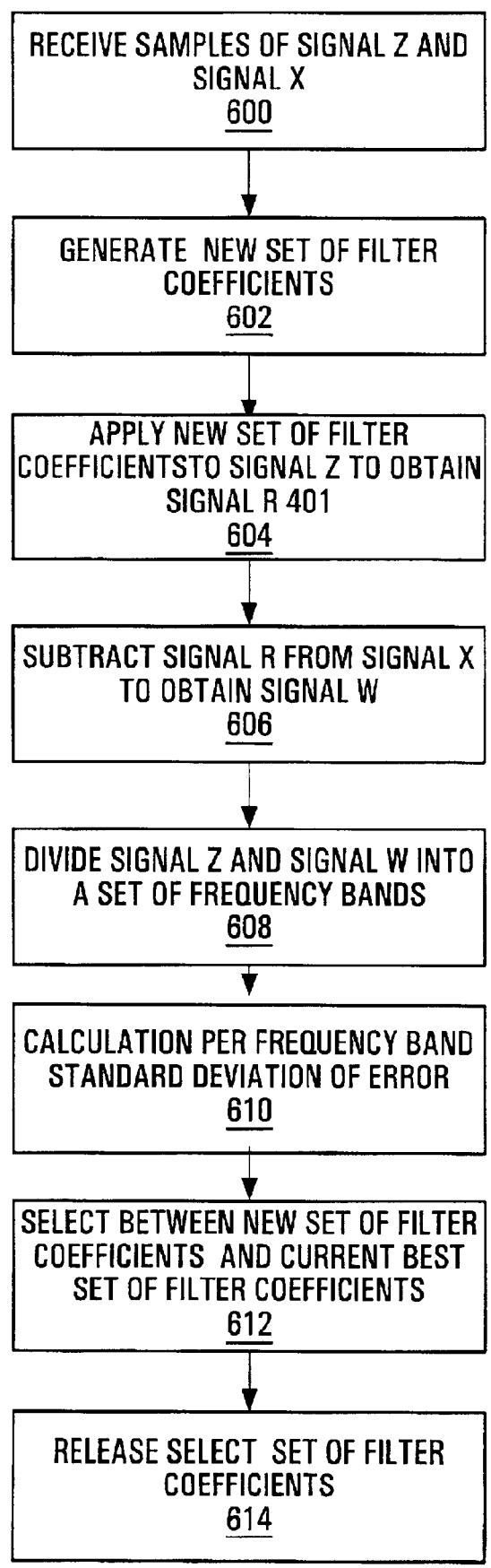
FIG. 7 is a flow diagram showing a process for generating a set of error characterization data elements in accordance with a specific example of implementation of the invention.

A typical interaction will better illustrate the functioning of the filter adaptation unit 202. A shown in the flow diagram of FIG. 7, at step 600 samples of signal Z 102 and signal X 104 are received by the coefficient adaptation unit 100. A step 602, the samples are processed at least in part on the basis of a least squares method to generate a set of filter coefficients Hnew 206. At step 604, the new set of filter coefficients Hnew 206 is applied by a filter simulation unit mimicking the behavior of filter 110 to signal Z 102 to obtained a filtered version of signal Z 102, namely signal R 401 (FIG. 4). At step 606, signal R 401 is subtracted from signal X 104 to obtain signal W 470. At step 608, signal Z 102 and signal W 470 are divided on a spectral basis into t/N sets of frequency bands. At step 610, a standard deviation of the error function is effected on the basis of signal Z 102 and sign W 470 is effected on per frequency band basis for each frequency band in the set of frequency bands. If the bands are narrow, a reasonable approximation can be made that, for a given signal, the signal in each band is white. Therefor the standard deviation computation can be expressed as follows:

For $j = 1 \ldots K - 1$  Equation 42

$$H_{error}[j] = \frac{\sum_{i=0}^{\frac{t}{N}-1} ((W_{i,SPECTRA}[j] \times Z_{i,SPECTRA}[j])^2)^{\frac{1}{2}}}{\left[\left(\sum_{i=0}^{\frac{t}{N}-1} Z_{i,SPECTRA}[j] \times Z_{i,SPECTRA}[j]\right)^2 - \left(\sum_{i=0}^{\frac{t}{N}-1} (Z_{i,SPECTRA}[j] \times Z_{i,SPECTRA}[j])^2\right)\right]^{\frac{1}{2}}}$$

At step 612, a set of filter coefficients is selected between the new set of filter coefficients generated at step 602 and a current best set of filter coefficients in the active coefficient set memory unit 240. The selection is made at least in part on the basis of the sets of error characteristic data elements associated to the new set of respective filter coefficients generated at step 602 and the current best set of filter coefficients. At step 614, the set of filter coefficients selected at step 612 is released for use by filter 110.

Figure 8:
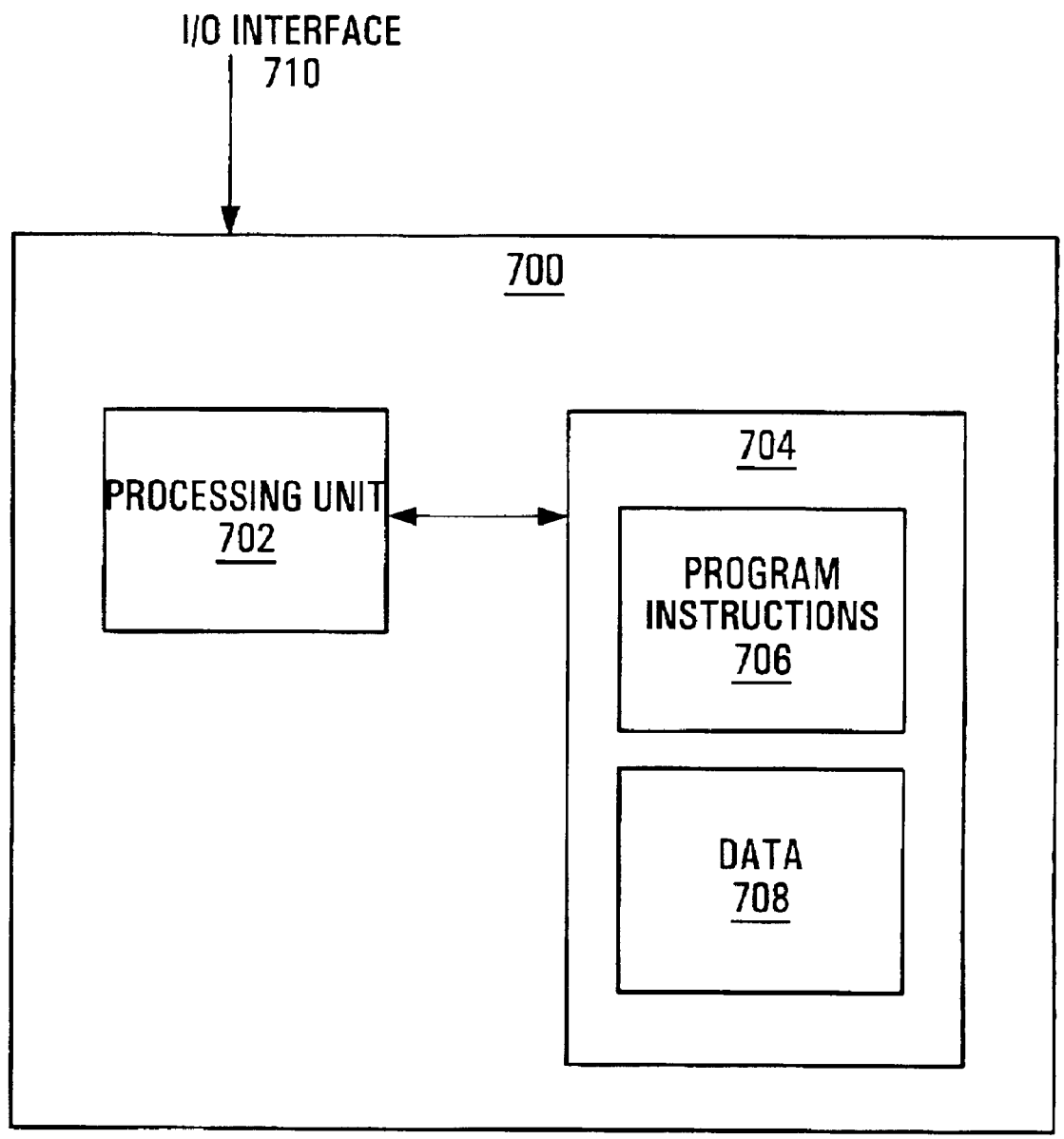
FIG. 8 is a block diagram of an apparatus for generating a set of filter coefficients in accordance with a specific example of implementation of the invention.

The above-described process for producing a set of filter coefficients can be implemented on a general purpose digital computer, of the type depicted in FIG. 8, including a processing unit 702 and a memory 704 connected by a communication bus. The memory includes data 708 and program instructions 706. The processing unit 702 is adapted to process the data 708 and the program instructions 706 in order to implement the functional blocks described in the specification and depicted in the drawings. The digital computer 700 may also comprise an I/O interface for receiving or sending data elements to external devices. For example, the I/O interface may be used for receiving the first signal Z 102 and the second signal X 104.

Alternatively, the above-described process for producing a set of filter coefficients can be implemented on a dedicated hardware platform where electrical/optical components implement the functional blocks described in the specification and depicted in the drawings. Specific implementations may be realized using ICs, ASICs, DSPs, FPGA or other suitable hardware platform. It will be readily appreciated that the hardware platform is not a limiting component of the invention.

Although the present invention has been described in considerable detail with reference to certain preferred embodiments thereof, variations and refinements are possible without departing from the spirit of the invention. Therefore, the scope of the invention should be limited only by the appended claims and their equivalents.

What is claimed is:

1. A filter adaptation unit suitable for producing a set of filter coefficients, said filter adaptation unit comprising:
    a) a first input for receiving a sequence of samples of a first signal;
    b) a second input for receiving a sequence of samples of a second signal, the second signal including a certain component which is correlated to the first signal;
    c) a third input for receiving a first set of error characterization data elements associated to a first set of filter coefficients, the first set of filter coefficients being such that when the first set of filter coefficients is applied by an adaptive filter on the first signal, a first estimate of the certain component in the second signal is generated, the certain component being correlated to the first signal;
    d) a coefficient generation unit operatively coupled to said first input and said second input, said coefficient generation unit being operative to generate a second set of filter coefficients at least in part on the basis of said first and second signals;
    e) an error characterization unit operative for processing the first signal and the second signal on the basis of the second set of filter coefficients to generate a second set of error characterization data elements associated to the second set of filter coefficients;
    f) a selection unit for selecting one of said first set of filter coefficients and said second set of filter coefficients at least in part on the basis of the first set of error characterization data elements and the second set of error characterization data elements;
    g) an output for releasing a signal indicative of the set of filter coefficients selected by the selection unit.

2. A filter adaptation unit as defined in claim 1, wherein each error characterization data element in the second set of error characterization data elements is associated to a respective frequency band selected from a set of frequency bands.

3. A filter adaptation unit as defined in claim 2, wherein said error characterization unit is operative for:
    a) filtering the first signal on the basis of the second set of filter coefficients to derive a second estimate of the certain component in the second signal, the certain component being correlated to the first signal;

b) removing from the second signal the second estimate of the certain component to generate a noise signal;

c) processing the noise signal and the first signal to generate the second set of error characterization data elements.

4. A filter adaptation unit as defined in claim 3, wherein said error characterization unit is operative for:

a) processing the first signal to derive a first set of spectral values, each spectral value in said first set corresponding to a respective frequency band selected from a set of frequency bands;

b) processing the noise signal to derive a second set of spectral values, each spectral value in said second set corresponding to a respective frequency band selected from the set of frequency bands;

c) generating the second set of error characterization data elements at least in part on the basis of the first set of spectral values and the second set of spectral values, each error characterization data element being associated to a respective frequency band from the set of frequency bands.

5. A filter adaptation unit as defined in claim 4, wherein said coefficient generation unit is operative for applying a least squares method on the first and second signals to derive the second set of filter coefficients.

6. A filter adaptation unit as defined in claim 5, wherein said error characterization unit is operative for computing a standard deviation data element for each frequency band in the set of frequency bands on the basis of the first signal and the noise signal.

7. A method suitable for producing a set of filter coefficients suitable for use by an adaptive filter, said method comprising:

a) receiving a sequence of samples of a first signal;

b) receiving a sequence of samples of a second signal, the second signal including a certain component which is correlated to the first signal;

c) providing a first set of error characterization data elements associated to a first set of filter coefficients, the first set of filter coefficients being such that when the first set of filter coefficients is applied by an adaptive filter on the first signal, a first estimate of the certain component in the second signal is generated, the certain component being correlated to the first signal;

d) generating a second set of filter coefficients at least in part on the basis of said first and second signals, the second set of filter coefficients being such that when the second set of filter coefficients is applied by an adaptive filter on the first signal, a second estimate of the certain component in the second signal is generated, the certain component being correlated to the first signal;

e) processing the first signal and the second signal on the basis of the second set of filter coefficients to generate a second set of error characterization data elements associated to the second set of filter coefficients;

f) selecting one of said first set of filter coefficients and said second set of filter coefficients at least in part on the basis of the first set of error characterization data elements and the second set of error characterization data elements;

g) releasing a signal indicative of the set of filter coefficients selected in f).

8. A method as defined in claim 7, wherein each error characterization data element in the second set of error characterization data elements is associated to a respective frequency band selected from a set of frequency bands.

9. A method as defined in claim 8, wherein said method comprises:

a) filtering the first signal on the basis of the second set of filter coefficients to derive a second estimate of the certain component in the second signal, the certain component being correlated to the first signal;

b) removing from the second signal the second estimate of the certain component to generate a noise signal;

c) processing the noise signal and the first signal to generate the second set of error characterization data elements.

10. A method as defined in claim 9, wherein said method further comprises:

a) processing the first signal to derive a first set of spectral values, each spectral value in said first set corresponding to a respective frequency band selected from a set of frequency bands;

b) processing the noise signal to derive a second set of spectral values, each spectral value in said second set corresponding to a respective frequency band selected from the set of frequency bands;

c) generating the second set of error characterization data elements at least in part on the basis of the first set of spectral values and the second set of spectral values, each error characterization data element being associated to a respective frequency band from the set of frequency bands.

11. A method as defined in claim 10, wherein said method comprises applying a least squares method on the first and second signals to derive the second set of filter coefficients.

12. A method as defined in claim 11, wherein said method includes computing a standard deviation data element for each frequency band in the set of frequency bands between the first signal and the noise signal to derive the second set of error characterization data elements.

13. A tangible computer readable medium including a program element suitable for execution by a computing apparatus for producing a set of tilter coefficients, the filter coefficients being suitable for use by an adaptive filter, said computing apparatus comprising: a) a memory unit; b) a processor operatively connected to said memory unit, said program element when executing on said processor being operative for: receiving a sequence samples of a first signal; ii. receiving a sequence of samples of a second signal, the second signal including a certain component which is correlated to the first signal; iii. receiving a first set of error characterization data elements associated to a first set of tilter coefficients, the first set of filter coefficients being such that when the first set of tilter coefficients is applied by an filter on the first signal, a first estimate of the certain component in the second signal is generated, the certain component being correlated to the first signal; generating a second set of filter coefficients at least in part on the basis of said first and second signals, the second set of filter coefficients being such that when the second set of filter coefficients is applied by an adaptive filter on the first signal, a second estimate of the certain component in the second signal is generated, the certain component being correlated to the first signal; processing the first signal and the second signal on the basis of the second set of tilter coefficients to generate a second set of error characterization data elements associated to the second set of filter coefficients; selecting one of said first set of tilter coefficients and said second set of filter coefficients at least in part on the basis of the first set of error characterization data elements and the second set of error characterization data elements, vii. releasing a signal indicative of the set of filter coefficients selected in vi).

14. A tangible computer readable medium as defined in claim 13, wherein each error characterization data element in the second set of error characterization data elements is associated to a respective frequency band selected from a set of frequency bands.

15. A tangible computer readable medium as defined in claim 14, wherein said program element when executing on said processor being operative for: a) filtering the first signal on the basis of the second set of filter coefficients to derive a second estimate of the certain component in the second signal, the certain component being correlated to the first signal; b) removing the second signal the second estimate of the certain component to generate a noise signal; c) processing the noise signal and the first signal to generate the second set of error characterization data elements.

16. A tangible computer readable medium as defined in claim 15, wherein said program element when executing on said processor being operative for: a) processing the first signal to derive a first set of spectral values, each spectral value in said first set corresponding to a respective frequency band selected from a set of frequency bands; b) processing the noise signal to derive a second set of spectral values, each spectral value in said second set corresponding to a respective frequency band selected from the set of frequency bands, c) generating the second set of error characterization data elements at least in part on the basis of the first set of spectral values and the second set of spectral values, each error characterization data element being associated to a respective frequency band from the set of frequency bands.

17. A tangible computer readable medium as defined in claim 16, wherein said program element when executing on said processor being operative for applying a least squares method on the first and second signals to derive the second set of filter coefficients.

18. A tangible computer readable medium as defined in claim 17, wherein said program element when executing on said processor being operative for computing a standard deviation data element for each frequency band in the set of frequency bands between the first signal and the noise signal to derive the second set of error characterization data elements.

19. An adaptive system comprising:
  a) a first input for receiving a sequence of samples from a first signal;
  b) a second input for receiving a sequence of samples of a second signal, the second signal including a certain component which is correlated to the first signal;
  c) a filter adaptation unit operatively coupled to said first and second inputs, said filter adaptation unit comprising:
    i. a memory unit for storing a first set of error characterization data elements associated to a first set of filter coefficients, the first set of filter coefficients being such that when the first set of filter coefficients is applied by an adaptive filter on the first signal, a first estimate of the certain component in the second signal is generated, the certain component being correlated to the first signal;
    ii. a coefficient generation unit for generating a second set of filter coefficients at least in part on the basis of said first signal and second signal, the second set of filter coefficients being such that when the second set of filter coefficients is applied by an adaptive filter on the first signal a second estimate of the certain component in the second signal is generated, the certain component being correlated to the first signal;
    iii. an error characterization unit operative for processing the first signal and the second signal on the basis of the second set of filter coefficients to generate a second set of error characterization data elements associated to the second set of filter coefficients;
    iv. a selection unit for selecting one of said first set of filter coefficients and said second set of filter coefficients at least in part on the basis of the first set of error characterization data elements and the second set of error characterization data elements;
    v. an output for releasing a signal indicative of the set of filter coefficients selected by the selection unit;
  d) an adaptive filter operatively coupled to said first input and to the output of said filter adaptation unit, said adaptive filter being operative to apply a filtering operation to the first signal on the basis of the set of filter coefficients received from said filter adaptation unit to generate an estimate of the component in the second signal, the component being correlated to the first signal.

20. An echo cancellor comprising the adaptive system of claim 19.

21. A filter adaptation unit suitable for producing a set of filter coefficients, said filter adaptation unit comprising:
  a) means for receiving a sequence of samples of a first signal;
  b) means for receiving a sequence of samples of a second signal, the second signal including a certain component which is correlated to the first signal;
  c) means for receiving a first set of error characterization data elements associated to a first set of filter coefficients, the first set of filter coefficients being such that when the first set of filter coefficients is applied by an adaptive filter on the first signal, a first estimate of the certain component in the second signal is generated, the certain component being correlated to the first signal, each error characterization data element in the first set of error characterization data elements being associated to a respective frequency band selected from a set of frequency bands;
  d) means for generating a second set of filter coefficients at least in part on the basis of said first and second signals, the second set of filter coefficients being such that when the second set of filter coefficients is applied by an adaptive filter on the first signal, a second estimate of the certain component in the second signal is generated, the certain component being correlated to the first signal;
  e) means for processing the first signal and the second signal on the basis of the second set of filter coefficients to generate a second set of error characterization data elements associated to the second set of filter coefficients, each error characterization data element in the second set of error characterization data elements being associated to a respective frequency band selected from a set of frequency bands;
  f) means for selecting one of said first set of filter coefficients and said second set of filter coefficients at least in part on the basis of the first set of error characterization data elements and the second set of error characterization data elements;
  g) means for releasing a signal indicative of the set of filter coefficients selected by the selection unit.

22. A filter adaptation unit suitable for producing a set of filter coefficients, said filter adaptation unit comprising:
  a) a first input for receiving a sequence of samples of a first signal;
  b) a second input for receiving a sequence of samples of a second signal, the second signal including a certain component which is correlated to the first signal;
  c) a third input for receiving a first set of error characterization data elements associated to a first set of filter coefficients, the first set of filter coefficients being such that when the first set of filter coefficients is applied by an adaptive filter on the first signal, a first estimate of the certain component in the second signal is generated, the certain component being correlated to the first signal, the first set of error characterization data elements including at least one element associated to a frequency band;

d) a coefficient generation unit operatively coupled to said first input and said second input, said coefficient generation unit being operative to generate a second set of filter coefficients at least in part on the basis of said first and second signals;

e) an error characterization unit operative for processing the first signal and the second signal on the basis of the second set of filter coefficients to generate a second set of error characterization data elements associated to the second set of filter coefficients, the second set of error characterization data elements including at least one element associated to a frequency band;

f) a selection unit for selecting one of said first set of filter coefficients and said second set of filter coefficients at least in part on the basis of the first set of error characterization data elements and the second set of error characterization data elements;

g) an output for releasing as signal indicative of the set of filter coefficients selected by the selection unit.

* * * * *

UNITED STATES PATENT AND TRADEMARK OFFICE
CERTIFICATE OF CORRECTION

PATENT NO. : 6,957,240 B2
DATED : October 18, 2005
INVENTOR(S) : Thomas J. Awad et al.

It is certified that error appears in the above-identified patent and that said Letters Patent is hereby corrected as shown below:

Column 22,
Lines 38, 48, 49, 60 and 63, "tilter" should be -- filter --.
Line 43, add -- i. -- after the colon.
Line 43, add -- of -- between "sequence" and "samples".
Line 50, add -- adaptive -- before "filter".
Line 52, add -- iv. -- before "generating".
Line 59, add -- v. -- before "processing".
Line 62, add -- vi. -- before "selecting".

Column 23,
Line 10, add -- from -- between "removing" and "the".

Signed and Sealed this

Sixteenth Day of May, 2006

JON W. DUDAS
*Director of the United States Patent and Trademark Office*